United States Patent
Jeon et al.

(10) Patent No.: US 7,145,407 B2
(45) Date of Patent: Dec. 5, 2006

(54) RADIO FREQUENCY VOLTAGE CONTROLLED OSCILLATOR

(75) Inventors: Sang-yoon Jeon, Seoul (KR);
Heung-bae Lee, Suwon-si (KR);
Chun-deok Suh, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/945,906

(22) Filed: Sep. 22, 2004

(65) Prior Publication Data

US 2005/0062553 A1 Mar. 24, 2005

(30) Foreign Application Priority Data

Sep. 23, 2003 (KR) .................. 10-2003-0066024

(51) Int. Cl.
*H03B 12/00* (2006.01)
(52) U.S. Cl. ................ 331/108 C; 331/117 FE; 331/117 R; 331/167
(58) Field of Classification Search .......... 331/117 R, 331/117 FE, 167, 108 C
See application file for complete search history.

(56) References Cited

U.S. PATENT DOCUMENTS 6,081,167 A * 6/2000 Kromat ............. 331/108 C

2002/0113659 A1 8/2002 Scoggins
2003/0095458 A1 5/2003 Park et al.
2003/0162343 A1 8/2003 Altmann

OTHER PUBLICATIONS

Andreani et al, *, IEEE Journal of Solid-State Circuits, vol. 37, No. 3, pp. 342-348, Mar. 2002 *Entitled: "Tail Current Noise Suppression in RF CMOS VCOs".

Hegazi et al, *, IEEE Journal of Solid-State Circuits, vol. 36, No. 12, pp. 1921-1930, Dec. 2001 *Entitled: "A Filtering Technique to Lower LC Oscillator Phase Noise".

* cited by examiner

*Primary Examiner*—Arnold Kinkead
(74) *Attorney, Agent, or Firm*—Lee & Morse, P.C.

(57) ABSTRACT

A radio frequency voltage controlled oscillator (RF VCO) includes a differential oscillator including two field effect transistors (FETs) in which an electric current flows laterally to a substrate and a current source including a bipolar transistor in which the electric current flows in a direction either perpendicular or lateral to the substrate from an emitter to a collector via a base. Therefore, 1/f noise is very small. Resultantly, the RF VCO using the bipolar junction transistor as the current source reduces the 1/f noise generated by the current source of a RF CMOS VCO and, ultimately, the phase noise of the VCO.

12 Claims, 5 Drawing Sheets

RADIO FREQUENCY VOLTAGE CONTROLLED OSCILLATOR

BACKGROUND OF THE INVENTION

1. Field of the Invention

The present invention relates to a radio frequency voltage controlled oscillator (RF VCO). More particularly, the present invention relates to an RF VCO that is capable of effectively reducing phase noise.

2. Description of the Related Art

Phase noise is rapid, short-term, random fluctuations in the phase of a wave, caused by time domain instabilities and is affected mostly by 1/f noise of a current source, such as a metal oxide semiconductor (MOS) device. The 1/f noise denotes self-noise of a device caused by the reunion of electrons generated between silicon (Si) and silicon oxide ($SiO_2$) when an electric current flows laterally from a source to a drain through a channel under a gate.

Phase noise has recently emerged as a major problem in designing a CMOS voltage controlled oscillator (VCO). This problem results from the 1/f noise in the current source of the VCO being up-converted into an LC tank of the VCO, thereby aggravating the phase noise. To prevent the up-conversion of the 1/f noise, additional active and passive devices are used.

FIG. 1 is a circuit diagram of a conventional radio frequency (RF) VCO. Referring to FIG. 1, an LC-type low pass filter, including an inductor Ld and a capacitor Cd, is interposed between a differential oscillator (OSC), including two metal oxide semiconductor field effect transistors (MOSFETs), and a current source SRC, including one MOSFET, such that the LC-type low pass filter may filter noise from a drain of the current source SRC.

FIG. 2 is a circuit diagram of another conventional RF VCO. Referring to FIG. 2, in addition to a first low pass filter connected to a drain of a current source SRC, a second low pass filter is connected to a source of the current source SRC by an inductor Ls. The second low pass filter prevents noise from coming through the source of the current source SRC.

The current source SRC may be configured in a cascade form by using two MOSFETs to reduce its channel length modulation, thereby preventing the up-conversion of the 1/f noise into an LC tank of the VCO. However, the configuration of the cascade-type current source SRC requires additional active and passive devices, which increase a size of the VCO as well as a unit price of the VCO, which is especially significant in a case of mass-production.

When the current source SRC is applied to a wireless communications terminal, there is also a high probability that an increase in a number of passive devices may cause a mismatching of inphase/quadrature (I/Q) signals generated by an output of the VCO in a direct conversion structure.

SUMMARY OF THE INVENTION

The present invention is therefore directed to a radio frequency voltage controlled oscillator (RF VCO), which substantially overcomes one or more of the problems due to the limitations and disadvantages of the related art.

It is a feature of an embodiment of the present invention to provide an RF VCO that is capable of effectively reducing noise induced by a current source of a voltage controlled oscillator.

It is another feature of an embodiment of the present invention to provide an RF VCO that is capable of reducing a mismatching of inphase/quadrature (I/Q) signals generated within a wireless communications terminal.

At least one of the above features and other advantages may be provided by a radio frequency voltage controlled oscillator including a differential oscillator including two field effect transistors (FETs) in which an electric current flows laterally to a substrate and a current source including a bipolar transistor in which the electric current flows in a direction perpendicular to the substrate. The bipolar transistor may be connected to a source of the FETs. The substrate may be P-type silicon. The FETs may be P-type FETs. The bipolar transistor may be an NPN-type bipolar transistor.

At least the above feature and other features and advantages may be provided by a radio frequency voltage controlled oscillator including a differential oscillator including two field effect transistors in which an electric current flows laterally to a substrate and a current source including a bipolar transistor in which the electric current flows in a direction lateral to the substrate. The RF VCO may further include a resonant coil in the differential oscillator, wherein the bipolar transistor is connected to the resonant coil. The substrate may be P-type silicon. The FETs may be P-type FETs. The bipolar transistor may be a PNP-type bipolar transistor.

BRIEF DESCRIPTION OF THE DRAWINGS

The above and other features and advantages of the present invention will become more apparent to those of ordinary skill in the art by describing in detail exemplary embodiments thereof with reference to the attached drawings in which.

DETAILED DESCRIPTION OF THE INVENTION

Korean Patent Application No. 2003-66024,filed on Sep. 23, 2003,in the Korean Intellectual Property Office, and entitled: "Radio Frequency Voltage Controlled Oscillator," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. Rather, these embodiments are provided so that this disclosure will be thorough and complete, and will fully convey the scope of the invention to those skilled in the art.

Figure 1:
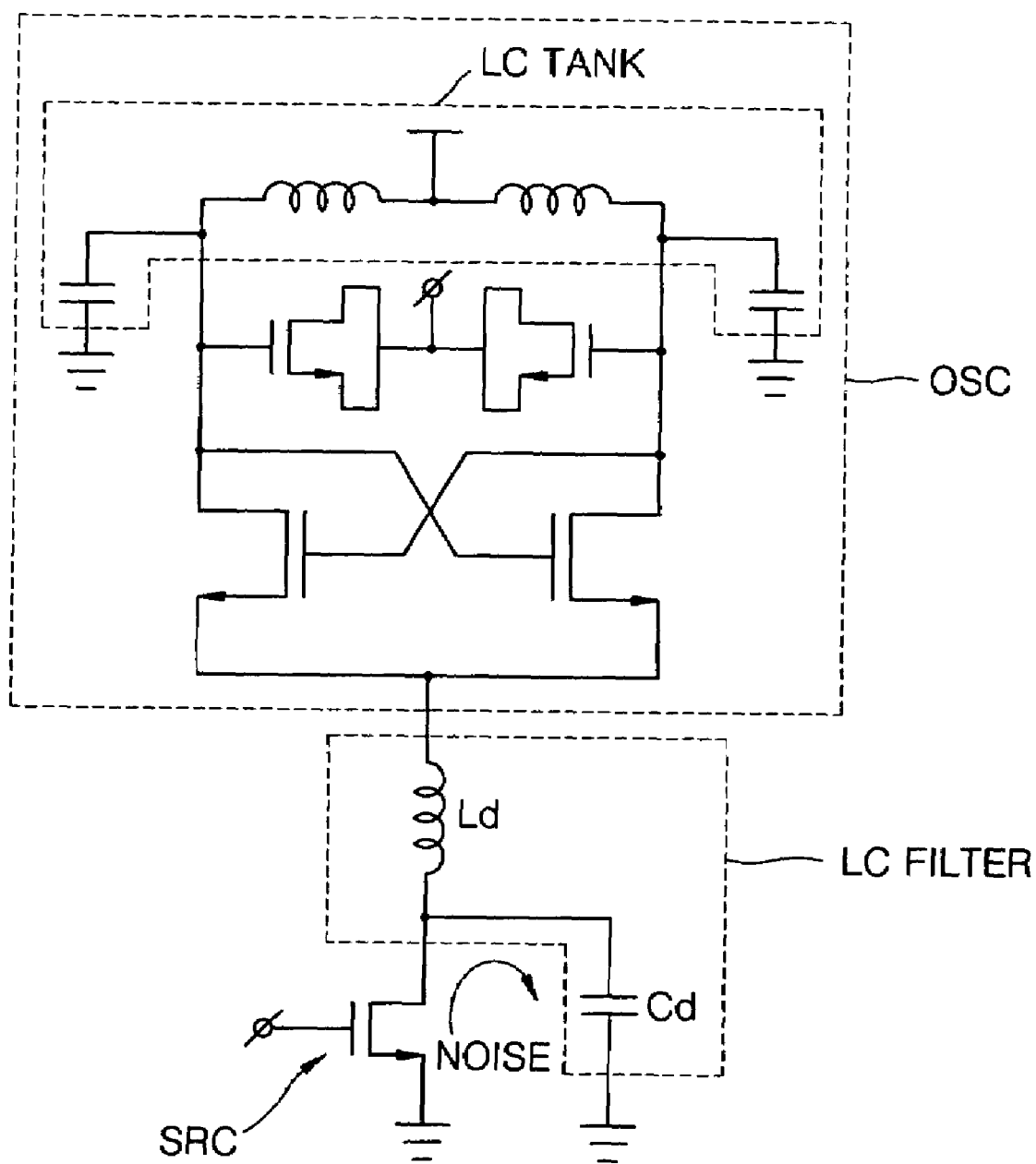
FIG. 1 is a circuit diagram of a conventional radio frequency voltage controlled oscillator (RF VCO)
Figure 2:
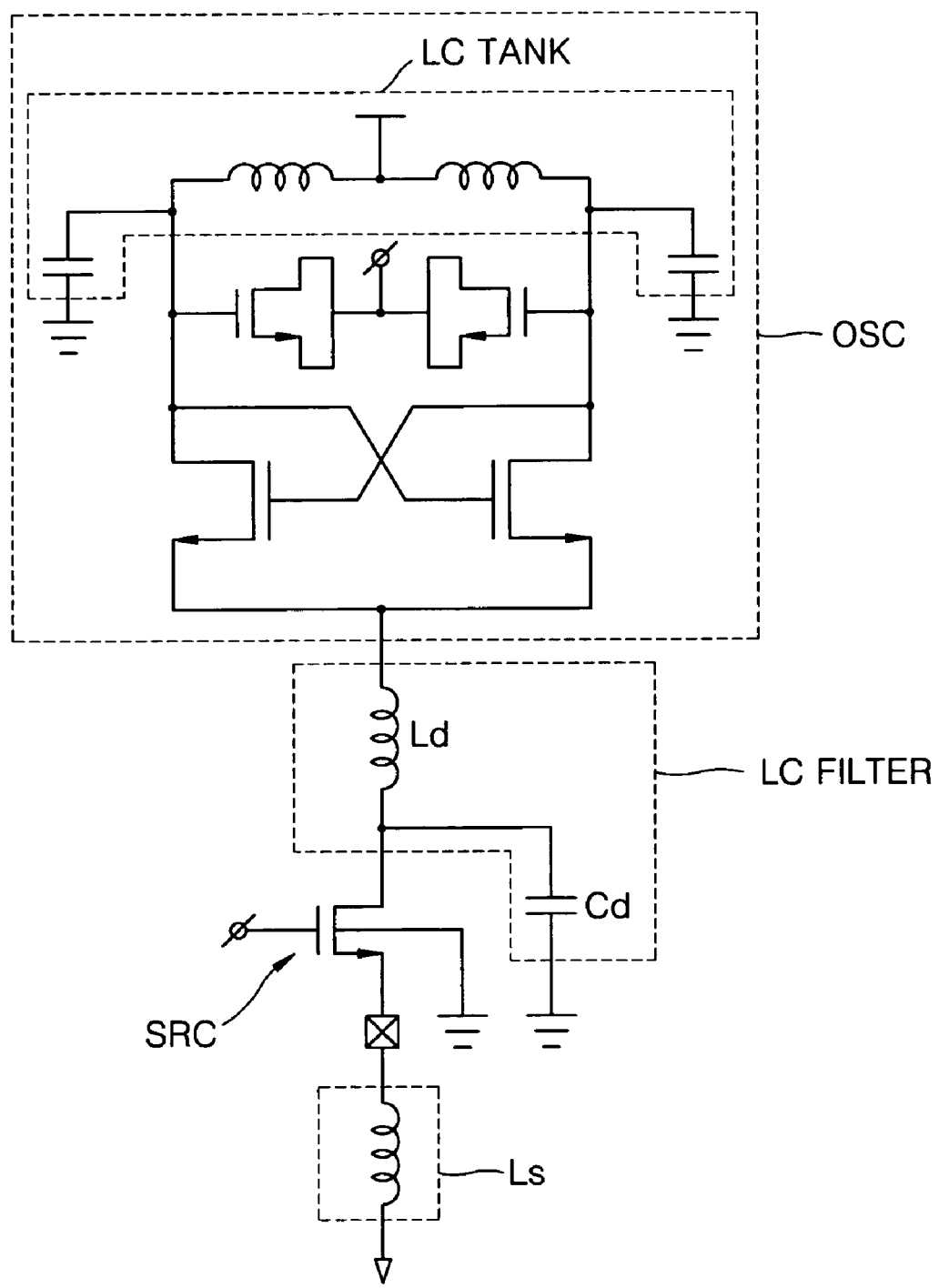
FIG. 2 is a circuit diagram of another conventional RF VCO.
Figure 3:
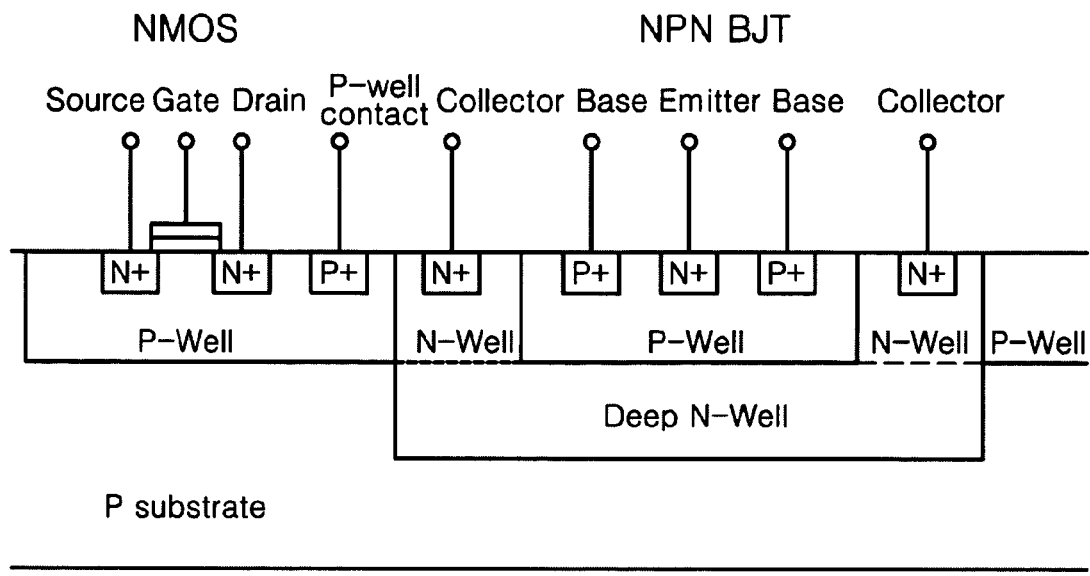
FIG. 3 illustrates a vertical sectional view of a portion of an RF VCO according to an embodiment of the present invention.

FIG. 3 illustrates a vertical sectional view of a portion of an RF VCO according to an embodiment of the present invention. More particularly, FIG. 3 illustrates a sectional view of a vertical NPN bipolar junction transistor (BJT) formed using a standard deep N-well CMOS process. Referring to FIG. 3, a high performance vertical NPN-BJT may be formed in a P-type substrate using the deep N-well CMOS process. In the CMOS process, an $N^+$ emitter and an $N^+$ collector are formed at the same time when diffusing an $N^+$ source and an $N^+$ drain of an NMOS transistor. During the diffusion process for a P-well and a $P^+$ contact of the NMOS transistor, a $P^+$ base of the BJT is also formed.

Alternatively, a PNP or the NPN-BJT may be similarly formed either vertically or laterally. In other words, the NPN or the PNP-BJT included in a radio frequency voltage controlled oscillator (RF VCO) according to an embodiment of the present invention is additionally formed during the CMOS process.

Alternatively, a bipolar transistor may be formed as a vertical PNP-BJT in the P-type substrate using a deep P-well CMOS process. In the CMOS process, a $P^+$ emitter and a $P^+$ collector are formed at the same time when diffusing a $P^+$ source and a $P^+$ drain of a PMOS transistor. During the diffusion process for a P-well and a $P^+$ contact of the PMOS transistor, a $N^+$ base of the BJT is also formed.

In addition, the bipolar transistor may include a lateral PNP-BJT formed in the P-type substrate using the CMOS process. In the CMOS process, the $P^+$ emitter and the $P^+$ collector are formed at the same time when diffusing the $P^+$ source and the $P^+$ drain of the PMOS transistor. During the diffusion process for the N-well and the $P^+$ contact of the PMOS, the $N^+$ base of the BJT is also formed.

In the RF VCO of an embodiment of the present invention, when a bipolar transistor, in which electric current flows in a direction perpendicular to the P-type silicon substrate, is used as the current source, a field effect transistor (FET) may be a P-type and the bipolar transistor may be an NPN-type in consideration of the capabilities of a semiconductor fabrication process.

However, when a bipolar transistor, in which electric current flows in a direction lateral to the P-type substrate, is used as the current source, the FET may be a P-type and the bipolar transistor may be a PNP-type in consideration of the capabilities of a semiconductor fabrication process.

Figure 4:
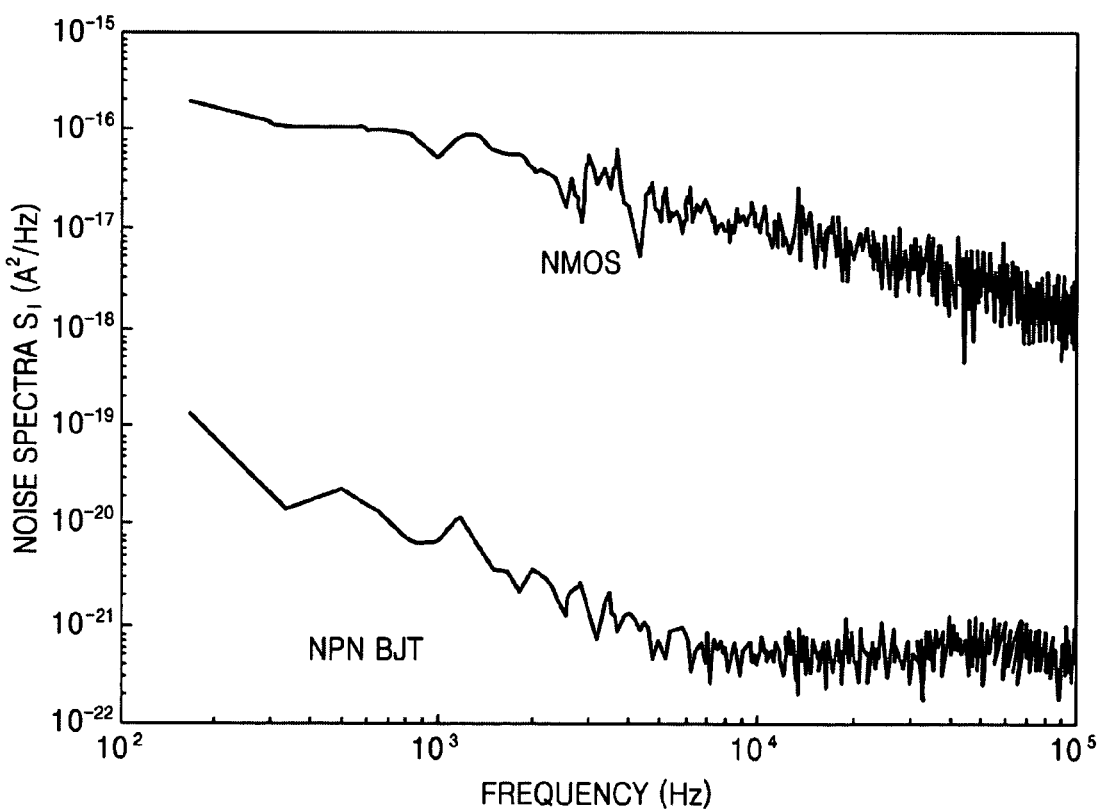
FIG. 4 is a graph illustrating 1/f noise of an NPN bipolar junction transistor (BJT) and a metal oxide semiconductor field effect transistor (MOSFET) according to an embodiment of the present invention.

FIG. 4 is a graph illustrating 1/f noise of the NPN-BJT and a metal oxide semiconductor field effect transistor (MOSFET) according to an embodiment of the present invention. Referring to FIG. 4, the BJT has much smaller noise than the MOS device. However, the BJT may not be used in a radio frequency circuit, such as an RF IC, due to its poor frequency characteristics since it is formed as an additional structure formed during the CMOS process. The poor characteristics of the BJT in the RF, however, may not be a problem in the present invention because the BJT is applied to a portion of the direct current (DC) block that does not work on the RF. The performance of the RF IC may be deteriorated by the noise up-converted from a direct current (DC) block. The BJT VCO formed by the standard BJT process may perform well, but consume more power and be more expensive than the CMOS VCO. Accordingly, the CMOS VCO is more popular than the BJT VCO.

Figure 5:
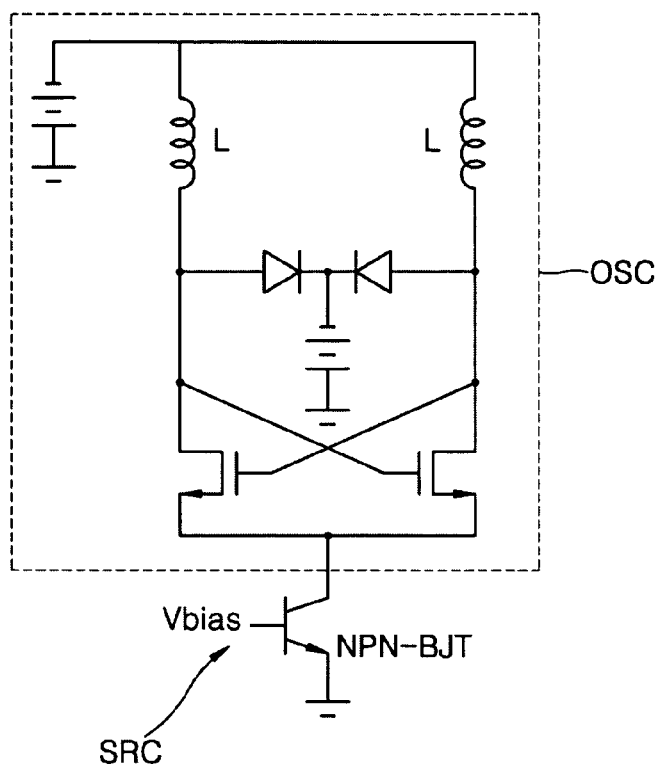
FIG. 5 is an equivalent circuit diagram of an RF CMOS VCO according to a first embodiment of the present invention.
Figure 6:
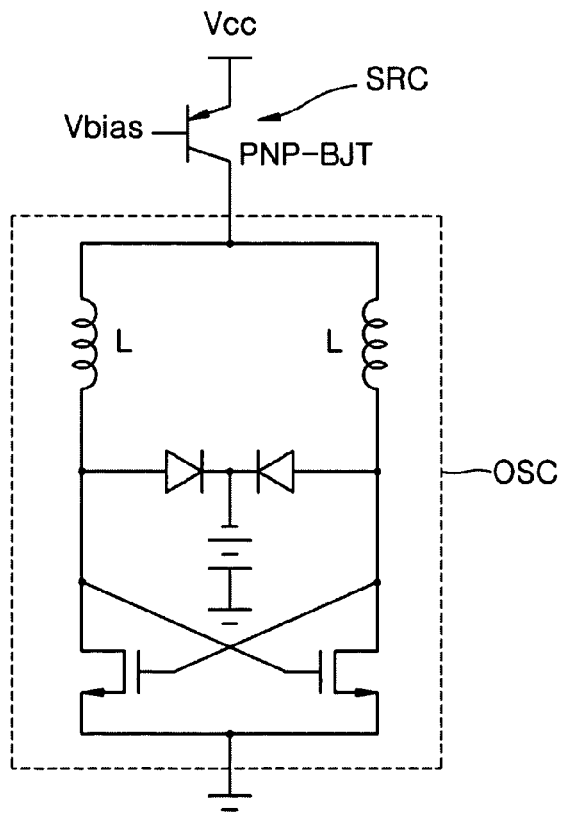
FIG. 6 is an equivalent circuit diagram of an RF CMOS VCO according to a second embodiment of the present invention.

FIG. 5 is an equivalent circuit diagram of an RF CMOS VCO including a differential oscillator (OSC) and a current source SRC having a vertical NPN-BJT according to a first embodiment of the present invention. FIG. 6 is an equivalent circuit diagram of an RF CMOS VCO including an OSC and a current source SRC having a lateral PNP-BJT according to a second embodiment of the present invention.

Referring to FIG. 5, the RF CMOS VCO according to the first embodiment of the present invention uses the vertical NPN-BJT as the current source SRC to reduce the phase noise of the RF CMOS VCO. The NPN-BJT is connected to a source of a FET included in the OSC.

Referring to FIG. 6, the RF CMOS VCO according to the second embodiment of the present invention uses the lateral PNP-BJT as the current source SRC to reduce the phase noise of the RF CMOS VCO. The PNP-BJT is connected to a resonant coil L included in the OSC.

The BJTs used in this way have little 1/f noise. Therefore, even though the 1/f noise is up-converted into the LC tank of the VCO, its effects on the phase noise of the VCO are negligible. Equation 1 shown below expresses the effects of the 1/f noise of the current source SRC on the phase noise of the VOC. As shown in Equation 1, the smaller the 1/f noise ($i_f^2$) of the current source, the smaller the phase noise of the VOC. Here, $\Delta\omega$ denotes an offset frequency.

$$L(\Delta\omega) \approx 10 \log\left[\frac{i_f^2}{\Delta\omega^2}\right] \quad (1)$$

Figure 7A:
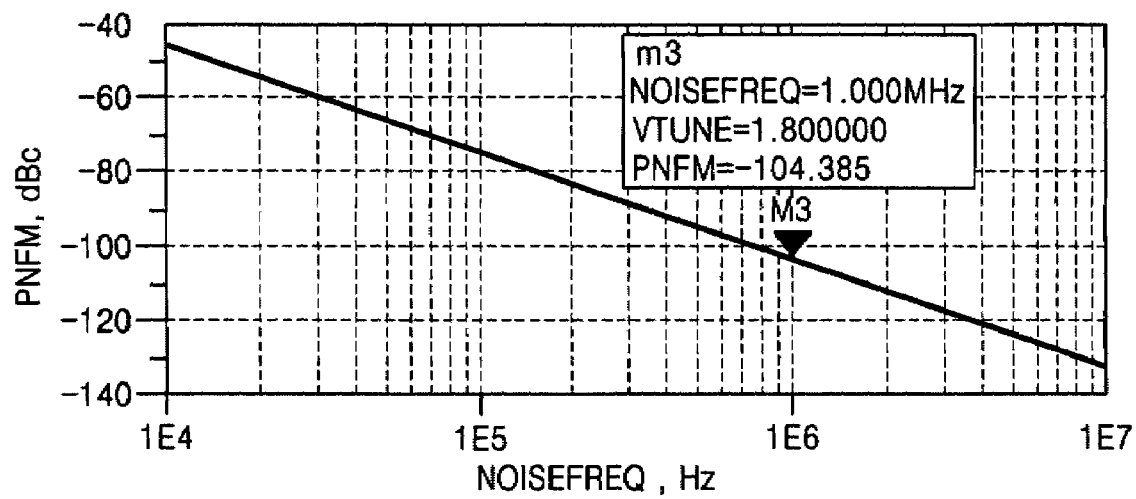
FIG. 7A is a graph illustrating the phase noise of a conventional RF VCO.
Figure 7B:
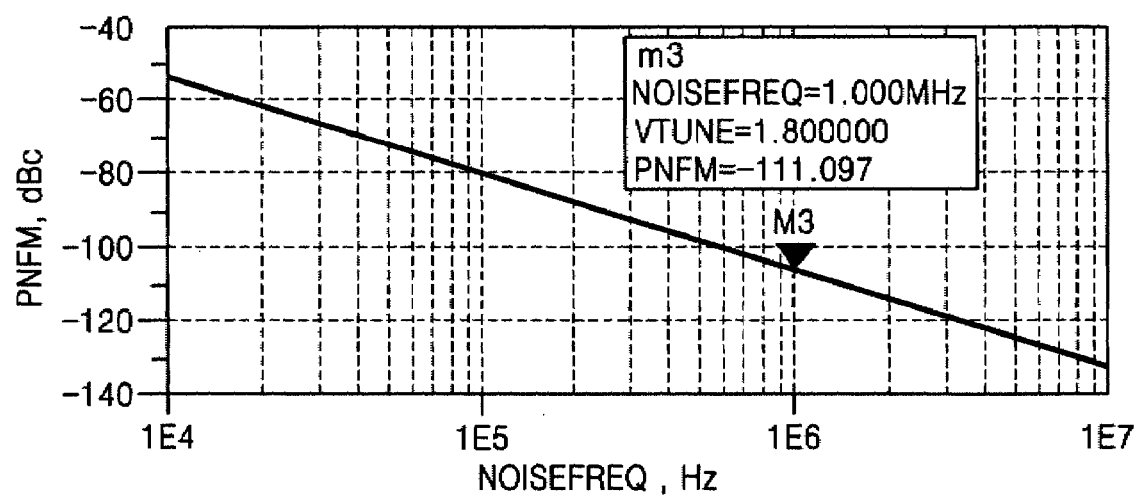
FIG. 7B is a graph illustrating the phase noise of an RF VCO according to an embodiment of the present invention.

FIG. 7A is a graph illustrating the phase noise of a conventional RF VCO. FIG. 7B is a graph illustrating the phase noise of an RF VCO according to an embodiment of the present invention.

Referring to FIGS. 7A and 7B, the RF VCO including the BJT according to an embodiment of the present invention reduces the phase noise by approximately 7 dB as compared to the conventional RF VCO using the FET as the current source on a frequency of 5 GHz.

The VCO configured to include only the BJT through the standard BJT process consumes a significant amount of power because the current is exponentially proportionate to voltage. However, the RF VCO according to an embodiment of the present invention includes the BJT formed additionally using the CMOS process, not the standard BJT process and uses the BJT as the current source. Therefore, an embodiment of the present invention may reduce the 1/f noise in the current source of the RF CMOS VCO, power consumption, and, ultimately, the phase noise of the VCO. Moreover, a chronic problem of the CMOS VCO may be overcome by implementing superior characteristics of the BJT in the CMOS process, thereby contributing to the field of the CMOS RF IC.

An RF VCO according to an embodiment of the present invention may offer one or more of the following advantages. First, it may significantly reduce phase noise caused by 1/f noise of a current source and a unit price of a VCO, which is especially significant in a case of mass-production, since additional devices and processes are not required. In other words, an inexpensive and compact RF CMOS VCO with superior characteristics may be realized.

Second, it may reduce a mismatching of inphase/quadrature (I/Q) signals generated within a wireless communications terminal. The RF VCO of the present invention is applied mostly to RF oscillators and may be applied to low frequency oscillators if necessary.

Exemplary embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A radio frequency voltage controlled oscillator, comprising:
    a differential oscillator including two field effect transistors (FETs) in which an electric current flows laterally to a substrate; and
    a current source including a bipolar transistor, the bipolar transistor including an emitter region, a base region and a collector region, at least a portion of the emitter region, the base region and the collector region forming a vertical stacked structure on the substrate such that the electric current flows within the bipolar transistor along a direction perpendicular to the substrate.

2. The radio frequency voltage controlled oscillator as claimed in claim 1, wherein the bipolar transistor is connected to a source of the FETs.

3. The radio frequency voltage controlled oscillator as claimed in claim 1, wherein the substrate is P-type silicon.

4. The radio frequency voltage controlled oscillator as claimed in claim 1, wherein the FETs are P-type FETs.

5. The radio frequency voltage controlled oscillator as claimed in claim 4, wherein the bipolar transistor is an NPN-type bipolar transistor.

6. A radio frequency voltage controlled oscillator including a resonant coil, the radio frequency voltage controlled oscillator comprising:
    a differential oscillator including two field effect transistors in which an electric current flows laterally to a substrate; and
    a current source including a bipolar transistor in which the electric current flows in a direction lateral to the substrate, the bipolar junction transistor being connected to the resonant coil.

7. The radio frequency voltage controlled oscillator as claimed in claim 6, wherein the substrate is P-type silicon.

8. The radio frequency voltage controlled oscillator as claimed in claim 6, wherein the FETs are P-type FETs.

9. The radio frequency voltage controlled oscillator as claimed in claim 8, wherein the bipolar transistor is a PNP-type bipolar transistor.

10. The radio frequency voltage controlled oscillator as claimed in claim 6 further including a second resonant coil, wherein the resonant coil and the second resonant coil each include an end connected to a common node and the bipolar junction transistor is connected to the common node.

11. The radio frequency voltage controlled oscillator as claimed in claim 1, wherein the emitter region, the collector region, a source region of each of the FETs and a drain region of each of the FETs were formed simultaneously.

12. A method of forming a radio frequency voltage controlled oscillator including a bipolar junction transistor and a differential oscillator including two metal oxide semiconductor (MOS) transistors, a first resonant coil and a second resonant coil, each resonant coil including an end connected to a common node, the method comprising:
    forming one of a deep n-well and a deep p-well on a substrate;
    simultaneously forming an emitter region of the bipolar junction transistor, a collector region of the bipolar junction transistor, a source region of each of the MOS transistors and a drain region of each of the MOS transistors on the substrate; and
    connecting the bipolar junction transistor to one of the common node and the source region of each of the MOS transistors.

* * * * *